Feb. 6, 1968 S. V. CAMPBELL ETAL 3,368,114
MICROELECTRONIC CIRCUIT PACKAGES WITH
IMPROVED CONNECTION STRUCTURE
Filed July 6, 1965
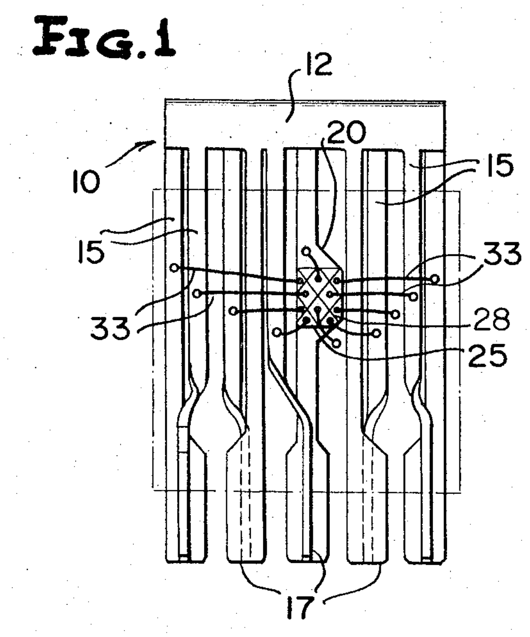
FIG. 1
FIG. 2
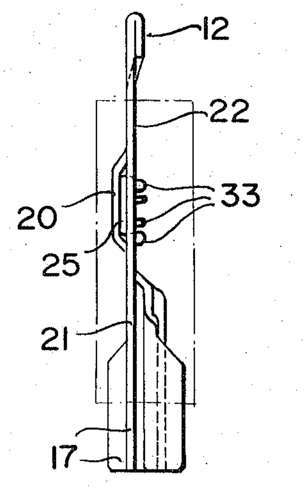
FIG. 3
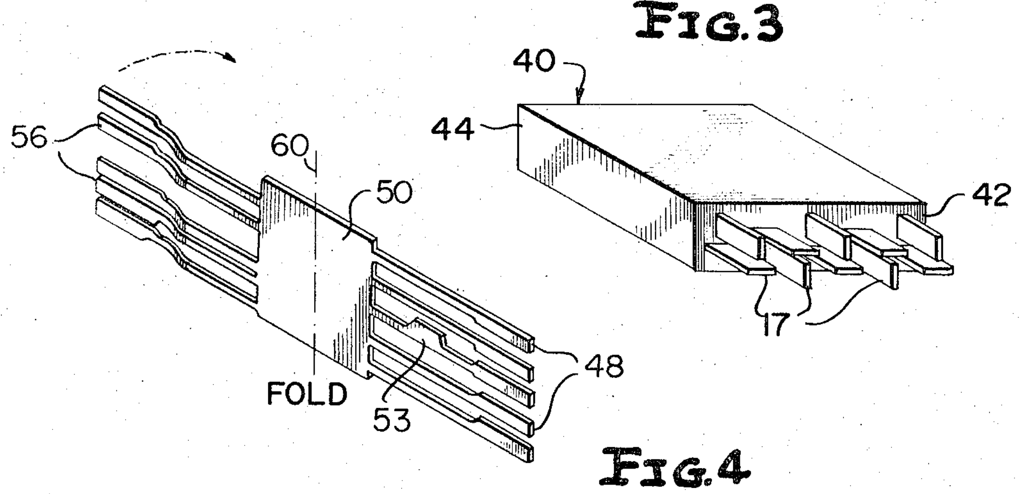
FIG. 3, FIG. 4
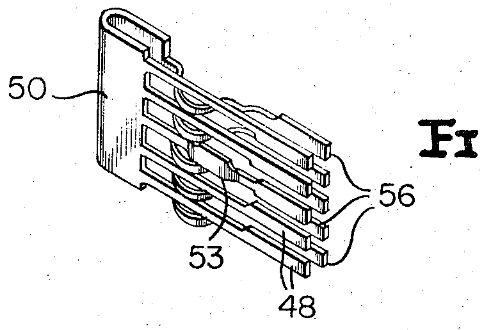
FIG. 5
INVENTOR
SCOTT V. CAMPBELL &
HANS SCHARLA-NIELSEN
BY Hurwitz & Rose
ATTORNEYS United States Patent Office 3,368,114

Patented Feb. 6, 1968

3,368,114
MICROELECTRONIC CIRCUIT PACKAGES WITH IMPROVED CONNECTION STRUCTURE

Scott V. Campbell, Melbourne, and Hans Scharla-Nielsen, Indialantic, Fla., assignors to Radiation Incorporated, Melbourne, Fla., a corporation of Florida Filed July 6, 1965, Ser. No. 469,806
8 Claims. (Cl. 317—101)

ABSTRACT OF THE DISCLOSURE

A microelectronic circuit package has a connector support structure for the circuit chips, the structure formed from electrically conductive material and including a common link from which a number of pins project as a keyed male connector array, one of the pins having an offset portion relative to the common plane in which portions of all of the pins lie, the displacement of the offset from the common plane being substantially equal to the thickness of the circuit chip to be bonded to the offset surface, the chip having conductive lands on an exposed face lying in the common plane, which lands are connected to selected points within the common plane on the pins, so that the chip, leads, and pin connection points may be encapsulated in a block of insulative material with the pin tips projecting from a surface of the block, after which the common link may be severed from the pins flush with opposite surface of the block.

The present invention relates generally to microelectronic circuit arrangments, and more particularly to improvements in mounting and packaging, and methods of mounting and packaging, microelectronic circuits.

Generally, microelectronic circuits of the type contemplated by the present invention are provided in the form of uncased integrated circuit chips comprising electrical circuitry which has been deposited, as a thin film, for example, on a thin slice of insulating substrate. Conductive portions of the circuit are provided in the form of lands on the substrate to permit the connection of extremely small leads, typically on the order of 0.001 inch diameter, thereto, the other end of each lead to be connected to circuitry external to the integrated circuit chip to form a system or subsystem including a plurality of such chips. The particular circuit requirements and the interconnection of the various chips will, of course, depend on the type of system desired and general design considerations.

Obviously, the micro-miniaturized form of the various components, including the chips themselves, the conductive lands by which the microelectronic circuits are to be coupled to external circuitry, and the leads for interconnection of the various circuits, present significant problems with respect to the ease and rapidity with which an entire system may be assembled, and subsequently, with which component parts may be replaced in the event of failure. Typically, to facilitate assembly and replacement the chips circuitry is electrically coupled, via the conductive leads, to male or female connectors of a size which is more conveniently handled. Usually an intermediate connector of one type or another, such as a silicon wafer, is coupled mechanically and electrically to the members which are employed as the final connectors, and the chip or chips mounted to such wafer or other intermediate connector. It is apparent that such arrangements may require several welds, in some cases as many as four or five, to connect a single chip land to the final connector pins via the intermediate connector or connectors.

It is, accordingly, a primary object of the present invention to provide methods of mounting and packaging microelectronic circuit chips which overcome one or more of the disadvantages of prior art packaging methods.

Another severe disadvantage of prior art methods of mounting and/or assembling microelectronic circuit chips for incorporation in a more extensive circuit or system is that the microelectronic circuits, because of these prior art arrangements, typically require assembly and mounting by microscopy techniques, an arduous and time-consuming task at best, and, if all connection points are not located in the same plane, there is additionally the requirement of focusing and refocusing the microscope for each plane in which a connection is to be made.

It is, therefore, another primary object of the present invention to provide microelectronic circuit mounts wherein all connection points lie in a single plane and are spaced by a distance adequate to permit the mechanized bonding or connecting of the several leads between chip lands and connectors.

It is another object of the present invention to provide a unitary mounting structure for one or more microelectronic circuit chips, the structure including the desired connector array as an integral part thereof, and the relative location of chip lands and connectors thereon being such that the interconnecting leads may be bonded by automated welding machinery, each connection requiring a maximum of only two welds.

Briefly, in accordance with the present invention there is provided a unitary metal strip sheet which has been suitably stamped to form a backbone from which a plurality of conductive elements or pins project in a comb-like configuration, a microelectronic circuit chip bonded to a widened or enlarged portion of one of the pins, a plurality of conductive leads connecting separate lands of the microelectronic circuit to separate ones of the pins, respectively, a molded block of resinous material encapsulated about that portion of the assembly including the chip and the connecting leads so that portions of the pins project from one end of the molded block while the backbone of the strip and portions of the pins adjacent thereto are exposed at an opposite end of the block, the latter thus being trimmable flush with the surface of that opposite end such that, after trimming, a complete modular package is provided in which the integrated circuit chip is at once protected from adverse environmental conditions and electrically coupled to rigid connector insertable pins in an easily handled and readily replaceable plug-in unit.

In accordance with a further aspect of the present invention, a method of providing modular package of the above-described type comprises stamping a sheet of metal to form a mutually linked plurality of connector pins in a substantially planar array, bending certain of the pins so that while each pin projects in the same general direction the tips of the pins are displaced and oriented relative to each other to form a keyed configuration in accordance with the configuration of the desired mating connector pattern, and recessing a portion of the length of one pin relative to the plane of the other pins along a corresponding portion of their lengths by an amount substantially equal to the thickness of the microelectronic circuit chip to be mounted thereon, bonding the chip to said recessed portion so that its uppermost surface relative to the surface of the connector sheet lies in the plane of the pins along said corresponding portion of their lengths, electrically connecting desired ones of the chip lands to desired ones of the pins via conductive leads, encapsulating that portion of the connector sheet incorporating the chip, conductive leads and electrical connection points in an insulative block of resinous material so that the tips of the pins project from one surface thereof and the pin-linking member projects from an opposite surface, and trimming said pin linking member flush with said opposite surface to electrically separate the pins from each other and provide a modular circuit plug-in unit.

The above and still further objects, features and attendant advantages of the present invention will become apparent upon consideration of the following detailed description of specific embodiments and process steps, especially when taken in conjunction with the accompanying drawings in which:

FIGURE 1 is a plan view of a microelectronic circuit chip mounted on a connector in accordance with the present invention;

FIGURE 2 is a side view of the mounting arrangement and connector shown in FIGURE 1;

FIGURE 3 s a perspective view of a modular plug-in package in which the microelectronic chip is encapsulated, showing a particular keyed pattern of connector pins; and FIGURES 4 and 5 are perspective views of an alternative connector configuration at various stages of development.

Referring now to FIGURES 1 and 2, the basic mounting member 10 comprises a sheet of electrically conductive material, such as copper, which has been suitably cut or stamped, for example, to form a backbone or linking member 12 having a plurality of rib-like projections 15 extending therefrom in a planar array. Mounting member 10 thus constitutes a comb-like structure having a plurality of conductive teeth whose end or tip portions 17 will form the male connecting pins in the completed modular unit. Member 10 may, if desired, be stamped so that conductive ribs 15 are slightly wider at the tip portions 17 to provide a larger area of conductive contact. In addition, one of the pins, preferably the most centrally located pin, is made wider along a portion 20 of its length to provide a chip mounting surface, this wider or enlarged portion being recessed, in any suitable manner, by the thickness of the microelectronic circuit chip 25 to be mounted thereon. That is, pin portion 20 is preferably displaced relative to the plane of the remaining pins, so that when chip 25 is bonded thereto the upper surface of the chip is substantially flush or aligned with the surface 22 of mounting member 10.

Alternate ones of the ribs 15 may be bent, twisted, or otherwise deformed along corresponding portions of their respective lengths so that each is superposed above or otherwise displaced relative to its originally adjacent pin, such that while certain of the pins are displaced from their original positions each pin maintains its initial projecting alignment in a longitudinal direction. Tip portions 17 may also be suitably twisted in a keyed pattern as dictated by the pattern of the mating connectors into which the final circuit module is to be inserted.

Microelectronic circuit chip 25 is mounted, such as by bonding with a suitable epoxy glue, to recessed region 20 of mounting member 10 so that its upper surface, that is, the surface opposite the bonded surface, is aligned with surface 22 of the mounting member.

At this point, connecting leads 33 may be electrically connected to desired conductive lands 28 on the chip and to predetermined points on the conductive ribs 15 so that separate ones of the lands are connected respectively to separate ones of the ribs in the manner dictated by the particular circuit design requirements. Each connection between lead and land or pin is preferably performed by automated machine welding and is particularly adapted to such a process since all connecting points lie in a single plane. Automated welding facilates the mass production of modular packages especially where a number of packages are to contain chips and electrical connections forming the same circuitry. It will be observed that but a single leads 33 and two welds are required to connect a desired circuit land of chip 25 to an electrical connector pin 15.

It will be understood that the entire mounting member 10 may be coated or plated with a highly conductive non-corrosive metal, e.g. gold, which is adapted to the welding process and which will promote the desired low resistance electrical contact between tip portions 17 and their mating connectors, as well as between leads and lands or pins. Alternatively, only those points of pins 15 at which the leads 33 are to be connected may be plated with a desired welding substrate.

Following the welding step, the thus-far completed unit is inserted into a mold (not shown) to permit a substantially rectangular portion of the mounting member encompassing the region at which chip 25 is bonded and the lead-connection points of the pins to be encapsulated in a plastic body of resinous material such as epoxy resin. Prior to and during the molding step the mounting members 10 may be fed into the mold and retained in position by suitable clamping means (not shown) conveniently clamped to the backbone portion 12. Thus, in addition to its use as a means for retaining all the connecting pins in fixed array during the production process, the backbone readily permits the use of automated feeder or conveyor techniques of manufacture by providing a convenient clamping support by which the individual units may be fed from one area of the production facility to another.

When the encapsulation material has been cured so that the desired portions of the unit are encapsulated in a relatively rigid block, the excess part of the mounting member 10, that is, that part comprising the backbone 12 and the exposed pin portions 15 linked thereby are trimmed off. Each pin 17 is thereby connected to a particular portion of the microelectronic circuit only via lead 33 and is insulated from all of the other pins by the mass of encapsulation material. A layer of insulative material such as epoxy resin may be applied to any exposed pins 15 at the surface from which the backbone has been trimmed, or to that entire surface, if desired.

The final modular plug-in package 40 is shown in FIGURE 3. Pins 17 project from surface or end 42 of the molded block and, as shown, have been twisted, prior to the encapsulation step, to form a keyed pattern which will mate only with a like-patterned connector array as dictated by the particular connecting board or panel requirements. Such as arrangement of connecting pins is, of course, purely exemplary, and it will be understood that the exposed pins may be arranged in any desired pattern.

FIGURES 4 and 5 show, in perspective view, an alternative arrangement for development of the chip-mounting connector member. In this embodiment, member 10 is again formed from a flat sheet of metal, but is cut or stamped so that the ribs or projecting pins extend from either side of an unviolated section 50. Again, a central one of pins 48 is provided with a widened and recessed region 53 on which the circuit chip is to be bonded. The pins 56 projecting from the other end of portion 50 are suitably bent or twisted so that when the entire member is folded over at fold line 60, a portion of the surface of each of pins 56 lies in the plane of pins 48 and the recessed region 53 lies displaced from this plane by the thickness of the micro-circuit chip. Hence, again all circuit connection points lie in a single plane so that the unit may be completely machine welded after the chip has been bonded to region 53. The process may then proceed in the manner described above relative to the embodiment of FIGURES 1–3.

While we have described certain exemplary embodiments and processes for practicing our invention, it will be apparent that various changes and modifications in the specific details of construction and process steps illustrated and described may be resorted to without departing from the true spirit and scope of the invention. It is therefore desired that the present invention be limited only by the appended claims.

We claim:

1. A connective support for incorporating microelectronic circuit chips in connector insertable circuit packages, comprising a plurality of spaced conductive connector pins, a common member integral with and linking said connector pins in a fixed array, a portion of the length of each pin lying in a common plane with a portion of the length of each of the other of said pins, said portion of the length of each of said pins including a preselected electrical connection point, at least one of said pins including an enlarged portion which is recessed relative to said plane, a microelectronic circuit chip bonded to said recessed portion of said at least one pin and having a thickness such that the circuit disposed on the chip lies in said plane, so that desired electrical connection points of said circuit and on said pins lie substantially in said common plane to facilitate the provision of conductive connections therebetween.

2. The combination according to claim 1 wherein said common member is folded over on itself, said connector pins projecting from opposite ends of said member, said opposite ends being parallel to the fold, the pins projecting from one of said ends being each positioned at a point within a respective space between pins projecting from the other of said ends.

3. A plug-in circuit module including the combination according to claim 1, wherein preselected electrical connection points of said circuit and on said pins are connected via conductive leads, said module further including a block of resinous insulative material encapsulating said microelectronic circuit chip, said conductive leads and the portion of said connector pin array at which said chip and said leads are disposed, so that the tips of said pins are exposed at a common surface of said block for insertion into a like array of mating connectors, said common member and connector pin portions immediately adjacent thereto initially exposed at a surface of said block opposite to said common surface having been severed therefrom.

4. The combination according to claim 3 wherein said tips of said connector pins are disposed in said array in a keyed pattern, preselected to permit the insertion of said module into a mating connector array in only one position of orientation of said module.

5. A mounting and connector structure for at least one microelectronic circuit chip having conductive regions on one face thereof, said structure comprising an electrically conductive member, an array of spaced electrically conductive connector pins linked by and projecting in a common direction from said member, at least one exposed surface portion of each pin disposed in a common plane with an exposed surface portion of each of the other pins, said exposed surface portions preselected as connecting points for electrical leads to be connected to said chip conductive regions, a portion of one of said pins having a surface offset from said common plane by an amount substantially equal to the thickness of said circuit chip, said offset surface dimensioned to receive said circuit chip in bonded relationship therewith, such that said chip face having the conductive regions thereon lies in said common plane.

6. The invention according to claim 5 wherein said pins project from opposite ends of said linking member, and wherein said linking member is folded over on itself such that the pins projecting from one end thereof occupy spaces between the pins projecting from the other end thereof, said opposite ends of the linking member being substantially parallel to one another and to the fold such that all of said pins project in said common direction.

7. A plug-in circuit module, comprising the mounting and connector structure according to claim 5, said circuit chip secured to said offset surface in said bonded relationship, a plurality of electrical leads conductively attached to respective ones of said preselected connecting points on said pins and of said conductive regions on said circuit chip face so as to provide desired interconnections therebetween, a block of insulative material encapsulating said circuit chip, said connecting point portions of said pins, and said leads forming said interconnections, the tips of said pins projecting from a surface of said block to form a male electrical connector array adapted to be received within a mating female connector, said linking member severed from said pins at the surface of said block opposite that from which the pin tips project, to electrically isolate said pins except via said interconnections and said circuit chip, and further insulative material covering the several ends of said pins which would otherwise be exposed at said opposite surface of said encapsulating block.

8. The plug-in circuit module according to claim 7 wherein said pins are flat-bladed, and the blades of the projecting tips of the pins are oriented in a distinctive pattern to permit only one position of said module for insertion of said male connector array into said mating female connector.

References Cited

UNITED STATES PATENTS

| | | | |
|---|---|---|---|
| 3,164,750 | 1/1965 | Miller | 317—101 |
| 3,262,022 | 7/1966 | Caracciolo | 317—101 |

ROBERT K. SCHAEFER, *Primary Examiner.*

J. R. SCOTT, *Assistant Examiner.*